(12) United States Patent
Morooka et al.

(10) Patent No.: US 7,486,559 B2
(45) Date of Patent: Feb. 3, 2009

(54) NON-VOLATILE SEMICONDUCTOR MEMORY DEVICE

(75) Inventors: Midori Morooka, Tokyo (JP); Koichi Fukuda, Berkeley, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 11/740,493

(22) Filed: Apr. 26, 2007

(65) Prior Publication Data

US 2007/0253254 A1 Nov. 1, 2007

(30) Foreign Application Priority Data

Apr. 26, 2006 (JP) .............................. 2006-122260

(51) Int. Cl.
*G11C 16/04* (2006.01)
(52) U.S. Cl. ............................ 365/185.17; 365/185.18; 365/185.01; 365/185.03; 711/100; 711/101; 711/102; 711/103
(58) Field of Classification Search ............ 365/185.17, 365/185.18, 185.01, 185.03; 711/100, 101, 711/102, 103
See application file for complete search history.

(56) References Cited

U.S. PATENT DOCUMENTS

| 6,614,689 | B2 | 9/2003 | Roohparvar |
| 6,751,122 | B2* | 6/2004 | Kawai et al. ........... 365/185.09 |
| 6,831,859 | B2 | 12/2004 | Hosono et al. |
| 2002/0039311 | A1* | 4/2002 | Takeuchi et al. ....... 365/185.09 |
| 2003/0142545 | A1* | 7/2003 | Imamiya et al. ........ 365/185.17 |
| 2005/0111259 | A1* | 5/2005 | Fukuda et al. ......... 365/185.11 |
| 2007/0245068 | A1* | 10/2007 | Yero .......................... 711/103 |

FOREIGN PATENT DOCUMENTS

JP 2004-40356 2/2004

\* cited by examiner

*Primary Examiner*—Richard Elms
*Assistant Examiner*—Eric Wendler
(74) *Attorney, Agent, or Firm*—Oblon, Spivak, McClelland, Maier & Neustadt, P.C.

(57) ABSTRACT

2 or more sets of initial setup data specifying different operation conditions are stored in a memory cell array comprising electrically-rewritable non-volatile memory cells arranged therein. A control circuit reads a set of initial setup data out of the 2 or more sets of initial setup data via an sense amplifier circuit based on the area information. The initial setup data is transferred to an initial setup data latch and stored therein.

11 Claims, 11 Drawing Sheets

NON-VOLATILE SEMICONDUCTOR MEMORY DEVICE

CROSS REFERENCE TO RELATED APPLICATIONS

This application is based on and claims the benefit of priority from prior Japanese Patent Application No. 2006-122260, filed on April 26, the entire contents of which are incorporated herein by reference.

BACKGROUND OF THE INVENTION

1. Field of the Invention

The present invention relates to a non-volatile semiconductor memory device. More particularly, it relates to a non-volatile semiconductor memory device with an area storing initial setup data in a memory cell array.

2. Description of the Related Art

In recent years, an electrically-rewritable non-volatile semiconductor memory device (hereinafter "EEPROM") has become large in capacity. A non-volatile semiconductor memory device is beginning to be adopted as secondary memory storage instead of a hard disk drive.

Especially, a NAND type EEPROM, which is configured with NAND memory cells connected in series is suitable for high density integration. For this reason, it is widely used for a secondary memory device, a memory card and the like used in a portable terminal such as a cellular phone.

In a conventional EEPROM, initial setup data including parameters for controlling various operations are stored in a memory cell array.

This initial setup data includes fail address data for defective cell replacement, voltage setup data for write voltage or the like, voltage adjustment data for adjusting setup voltage in response to fluctuation of processes, and control parameters for various operations such as data write and data erase. This initial setup data is read from a memory cell array when a power supply is turned on, and are transferred into various setting registers. Thereafter, a memory performs operation of writing, reading erasing and the like, based on the initial setup data stored in these various setting registers (see JP 2001-176290).

However, such a conventional memory stores only one set of initial setup data in a memory cell array. There sometimes arises a need that a usage or a application of the memory device should be changed after initial setup data are programmed. In that case, the memory cell array must be initialized or erased, and initial setup data corresponding to the usage or the application to be needed must be programmed again.

SUMMARY OF THE INVENTION

According to one aspect, the present invention provides a non-volatile semiconductor memory device comprising a memory cell array including arranged electrically-rewritable non-volatile memory cells, and including an area storing two or more sets of initial setup data specifying different operation conditions. A sense amplifier detects data in the memory cell array. Initial setup data read from the memory cell array via the sense amplifier is transferred and stored in an initial setup data latch. A control circuit controls reading one set of initial setup data out of the two or more sets of initial setup data based on area information selecting at least one set of initial setup data of the memory cell array.

DETAILED DESCRIPTION OF THE EMBODIMENTS

Hereafter, embodiments of the present invention will be explained with reference to the attached drawings.

The First Embodiment

Figure 1:
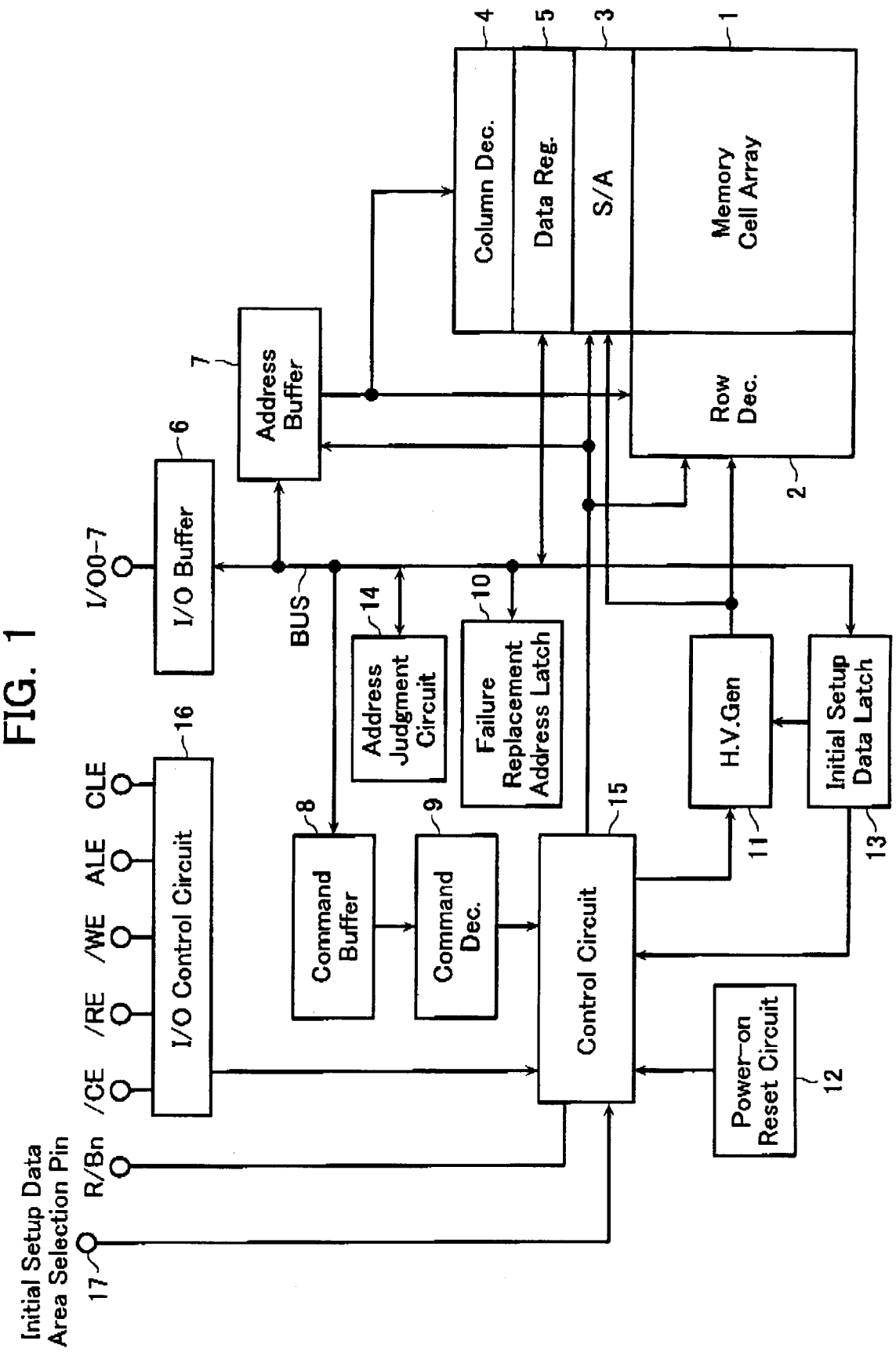
FIG. 1 is a block diagram showing a configuration of a NAND type flash memory according to the first embodiment.
Figure 2:
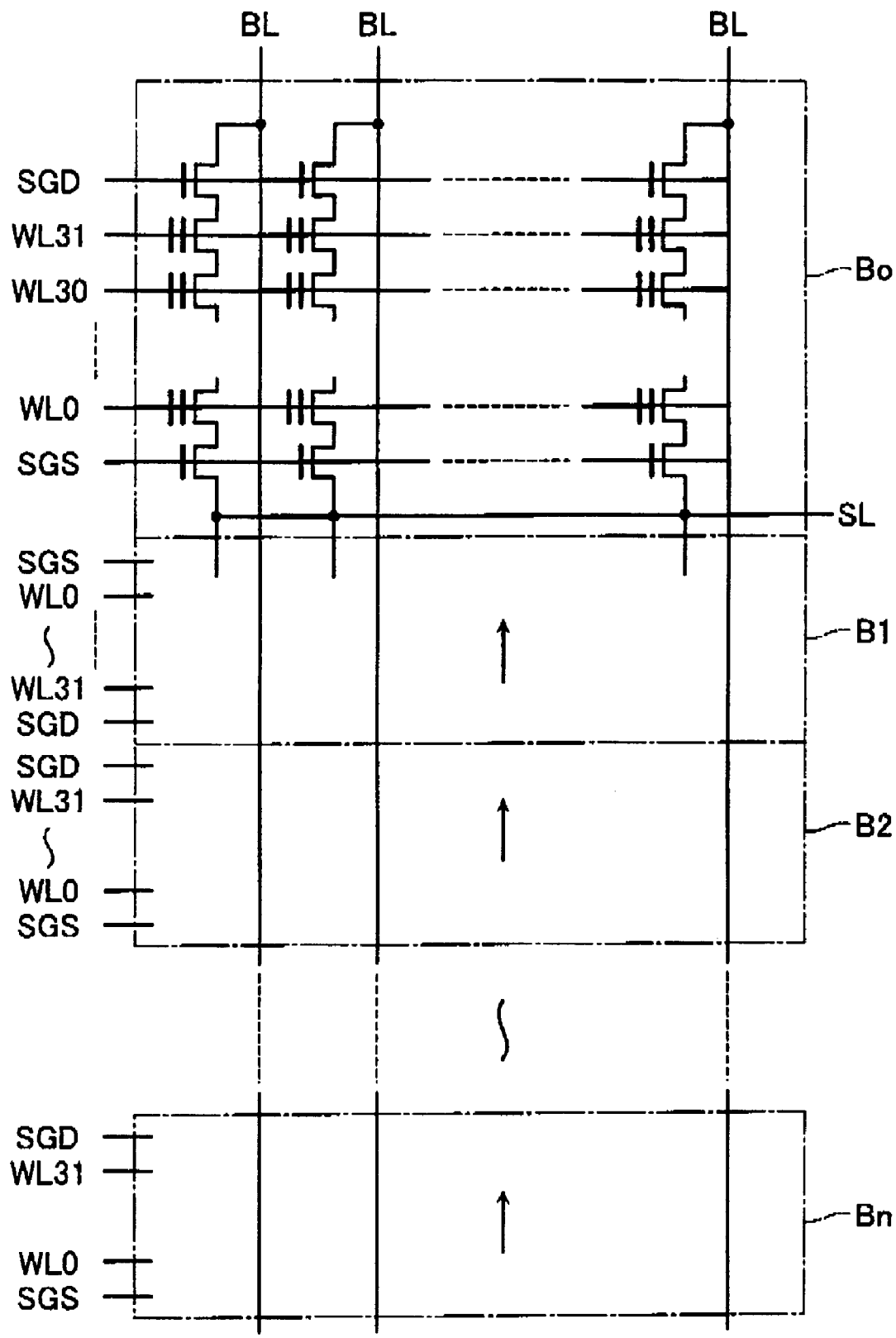
FIG. 2 is a diagram showing a concrete configuration of a memory cell in the NAND type flash memory according to the first embodiment.

FIG. 1 is a block diagram showing a configuration of a NAND type flash memory according to the first embodiment of the present invention. Moreover, FIG. 2 is a diagram showing a concrete configurative example of the memory cell array of the NAND type flash memory according to the first embodiment. This NAND type flash memory (hereinafter referred to as a "memory") is equipped with a memory cell array 1 shown in FIG. 2. Arranged NAND cell units configures the memory cell array 1.

Each NAND type cell unit comprises a plurality of electrically-rewritable non-volatile memory cells connected in series, as shown in FIG. 2. In this example, 32 non-volatile memory cells are connected in series in the NAND type cell unit. Furthermore, selection gate transistors for connecting a source line SL and a bit line BL respectively are connected to the both ends of the serially connected non-volatile memory cells.

The non-volatile memory cell has a MOS transistor structure of a stacked gated type with a floating gate and a control gate stacked therein. The memory cells sharing a same word line configure a page used as a unit of data read and data write. Furthermore, a plurality of pages selected by a same selection gate transistor constitute a block Bi (i=0–n). A block usually serves as a unit of data erase operation. In addition, a redundant row cell array and a redundant column cell array for replacing a defective row and a defective column are provided in the memory cell array 1.

A row decoder 2 selectively drives word lines and selection gate lines in accordance with row addresses, and includes a word line/selection gate line driver. A sense amplifier 3 is connected to a bit line and detects written data at the time of reading operation. The detected data is transferred to the data register 5 and stored therein.

Data transfer and reception between the data register 5 and external input pins I/O 0-7 are performed through an I/O buffer 6 and a data bus BUS. The address Add inputted through the external input pins I/O 0-7 is transferred to the row decoder 2 and a column decoder 4 through an address buffer 7.

The command Com inputted through the external input pins I/O 0-7 is decoded by the command decoder 9. Thereafter, it is transferred to a control circuit 15 via a command buffer 8. The control circuit 15 controls various operations such as data write and data erase, based on an external address Add and a command Com.

A internal-voltage generating circuit 11 is controlled by the control circuit 15, and generates various internal voltages necessary for operation of data write, erase and read. As a component of internal-voltage generating circuit 11, a booster circuit is employed for generating internal voltage higher than power supply voltage.

A power-on-reset circuit 12 detects supply of the power to a memory has been started, and makes the control circuit 15 to start an initialization operation.

Outputted from pin R/Bn is the ready/busy status showing that the memory cell array is in busy state or in the process of read, write, or erase operation.

Moreover, an I/O control circuit 16 receives signals from: a chip enable pin /CE for selecting a chip; a read enabling pin /RE for outputting serial data; a write enabling pin /WE for inputting data from external input pins I/O 0-7; an address latch enabling pin /ALE for recognizing data from external input pins I/O 0-7 as an address: and a command latch enabling pin /CLE for recognizing data from the external input pins I/O 0-7 as a command.

Figure 3:
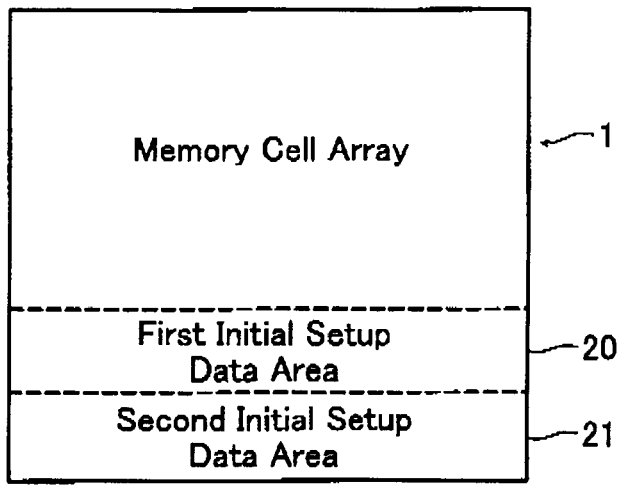
FIG. 3 is a diagram showing a configuration of a memory cell array of the NAND type flash memory according to the first embodiment.

As shown in FIG. 3, the memory cell array 1 is provided with initial setup data areas having initial setup data that specifies an operation condition of a memory. This initial setup data includes: (1) failure address data for defective cell replacement; (2) voltage setup data for a write voltage or the like generated at the internal-voltage generating circuit 11; (3) voltage adjustment data for adjusting internal setup voltages in response to fluctuation of processes; and (4) control parameters for various operations such as data write and data erase. The control circuit 15 reads out the voltage setup data and the voltage adjustment data from an initial setup data area during an initial operation to restore them in the initial setup data latch 13. Moreover, the control circuit 15 reads a defective address and a redundant address replaced by a defective address from the initial setup data area to store them in a failure replacement address latch 10.

An address judgment circuit 14 judges whether the address Add inputted from the I/O buffer 6 coincides with the defective address stored in the failure replacement address latch 10. When they coincide with each other, the address judgment circuit 14 operates so that replacement of a defective address by a redundant address may be done.

Figure 4:
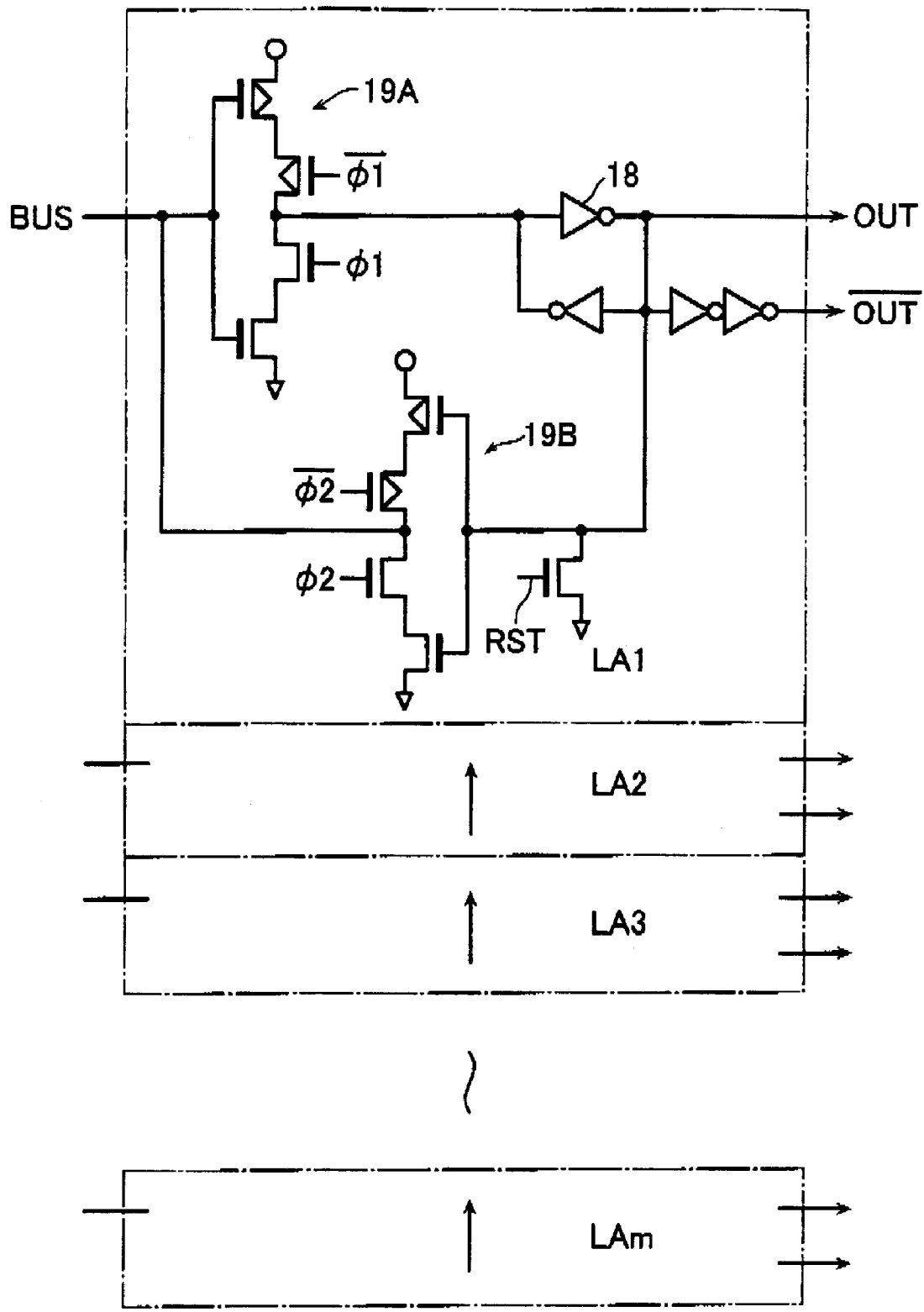
FIG. 4 is a diagram showing a configuration of an initial setup data latch of the NAND type flash memory according to the first embodiment.

The initial setup data latch 13 is configured with two or more latch circuits LA1-LAm as shown in FIG. 4. Each latch circuit LA1-LAm has a latch unit 18 and a clocked inverter 19A for obtaining data. Furthermore, each latch circuit LA1-LAm has a clocked inverter 19B for outputting the data held therein to a data bus on an input side. This data latch 13 is reset by the reset signal RST generated at the time of power-on, or generated by an external command on a test mode. The data latch 13 holds data during the normal memory operation.

The initial setup data area is provided with two sets of initial setup data area corresponding to different operation conditions: a first initial setup data area 20, and a second initial setup data area 21.

This first initial setup data area 20 and the second initial setup data area 21 each may store different sets of initial setup data corresponding to different operation conditions, as shown in the following example.

(First Example of Setting)

A two-value memory storing 1-bit data per one cell is different from and a multi-value memory storing data of 2 bits or more per one cell in view of an optimum setting value of various internal voltages or the like including a write voltage. In this case, initial setup data for two-value cells, and the initial setup data for multi-value cells may be stored in the initial setup data area 20 and 21, respectively.

(Second Example of Setting)

A write speed of data and a reliability of the written data usually have a trade-off relationship. In this case, Initial setup data providing a low data-writing speed and a high reliability of written data, and initial setup data providing a high data-writing speed and a low reliability of written data may be stored in the initial setup data area 20 and 21, respectively.

(Third Example of Setting)

Similarly, when guaranteeing reliability, the guaranteed number of data rewriting and a data-writing speed usually have a trade-off relationship. In this case, initial setup data providing a large guaranteed number of data rewriting and a low data writing speed, and initial setup data providing a small guaranteed number of data rewriting and a high data writing speed may be stored in the initial setup data area 20 and 21, respectively.

In addition, operation conditions are not limited to the above examples. Any initial setup data corresponding to different operation conditions may be stored in the first initial setup data area 20 and the second initial setup data area 21. Moreover, for example, initial setup data may be configured by combining plural operation conditions. For example, an operation condition for two-value cell and providing high data-writing speed may be provided.

An initial setup data area selection pin 17 receives a input of area information that selects either the first initial setup data area 20 or the second initial setup data area 21 before a power supply is on. For example, on selecting the first initial setup data area 20, the area information, that is, the level of the initial setup data area selection pin 17 is made "H". On selecting the second initial setup data area 21, the area information, that is, the level of the initial setup data area selection pin 17 is made "L". Thereby, either the first initial setup data area 20 or the second initial setup data area 21 may be selected.

Figure 5:
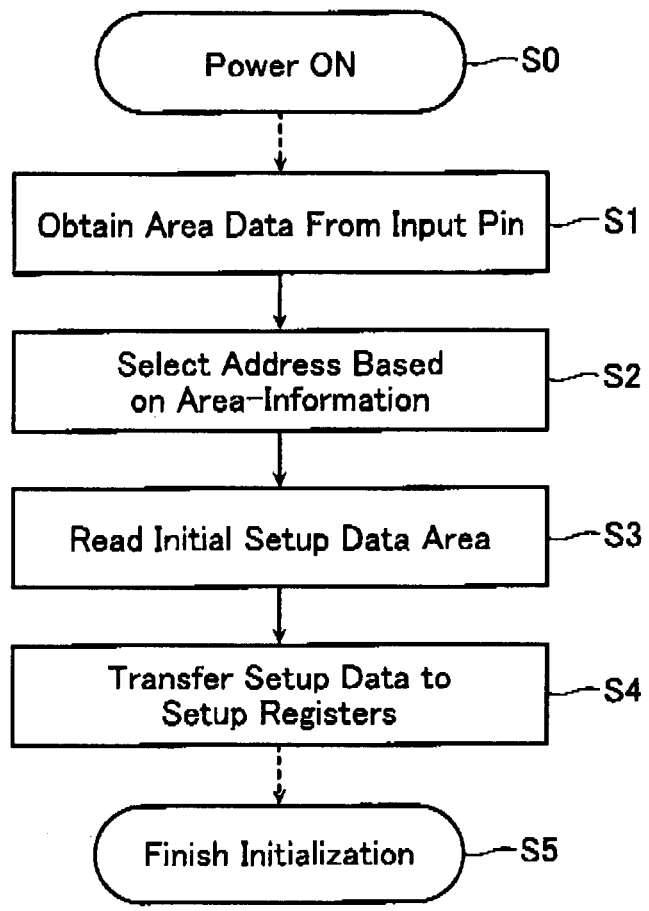
FIG. 5 is a diagram showing a control procedure of initial setup operation in the NAND type flash memory according to the first embodiment.

FIG. 5 is a diagram showing the flow of initial setup operation. If a start of power supply is detected (Step S0), the control circuit 15 obtains area information from the initial setup data area selection pin 17 (Step S1), and the address of either the first initial setup data area 20 or the second initial setup data 21 is selected according to this area information (Step S2).

Next, initial setup data is read from the selected initial setup data area (Step S3). Then, the read initial setup data is transferred into various setting registers, such as the initial setup data latch 13 and the failure replacement address latch 10 (Step S4). Thereby, initialization operation is completed (Step S5).

In this way, the two initial setup data areas, that is, the first initial setup data area 20 and the second initial setup data area 21 may store sets of initial setup data that are different in accordance with different operation conditions. Thereafter, initial setup data can be chosen according to a usage or a application.

This makes it possible that, when producing plural kinds of memory products with different operation conditions, the production rates of the different kinds of the memory products may be controlled according to the demands, after programming above-described initial setup data.

A two-value memory storing 1-bit data per one cell is generally the same in structure as a multi-value memory storing data of 2 bits or more per one cell. A conventional multi-value memory, however, stores initial setup data for multi-value cells only, after a shipment of a memory product. Therefore, the memory may serve as a multi-value memory only.

On the other hand, in this embodiment, both initial setup data for two-value calls and initial setup data for multi-value cells are stored in a memory cell array.

Selection of the initial setup data for two-value cells or for multi-value cells is made possible even after the test process has been finished.

According to this embodiment, when both a test for two-value cells and a test for multi-value cells are conducted in a test process, both initial setup data for two-value cells and initial setup data for multi-value cells may be stored in the initial setup data areas. This makes it unnecessary to input initial setup data in accordance with the test to be conducted from a test equipment, every time a test for two-value cells and a test for multi-value cell are switched there between. This is profitable because it improves TAT of tests, and allows simple test equipments to be used for the tests.

In this embodiment, although the number of the initial setup data areas storing sets of initial setup data for different operation conditions is two, this does not limit the number. The number of initial setup data areas may be selected according to the number of initial setup data areas that one wish to choose. In that case, two or more initial setup data area selection pins 17 may be provided so as to select any initial setup data areas.

The Second Embodiment

Figure 6:
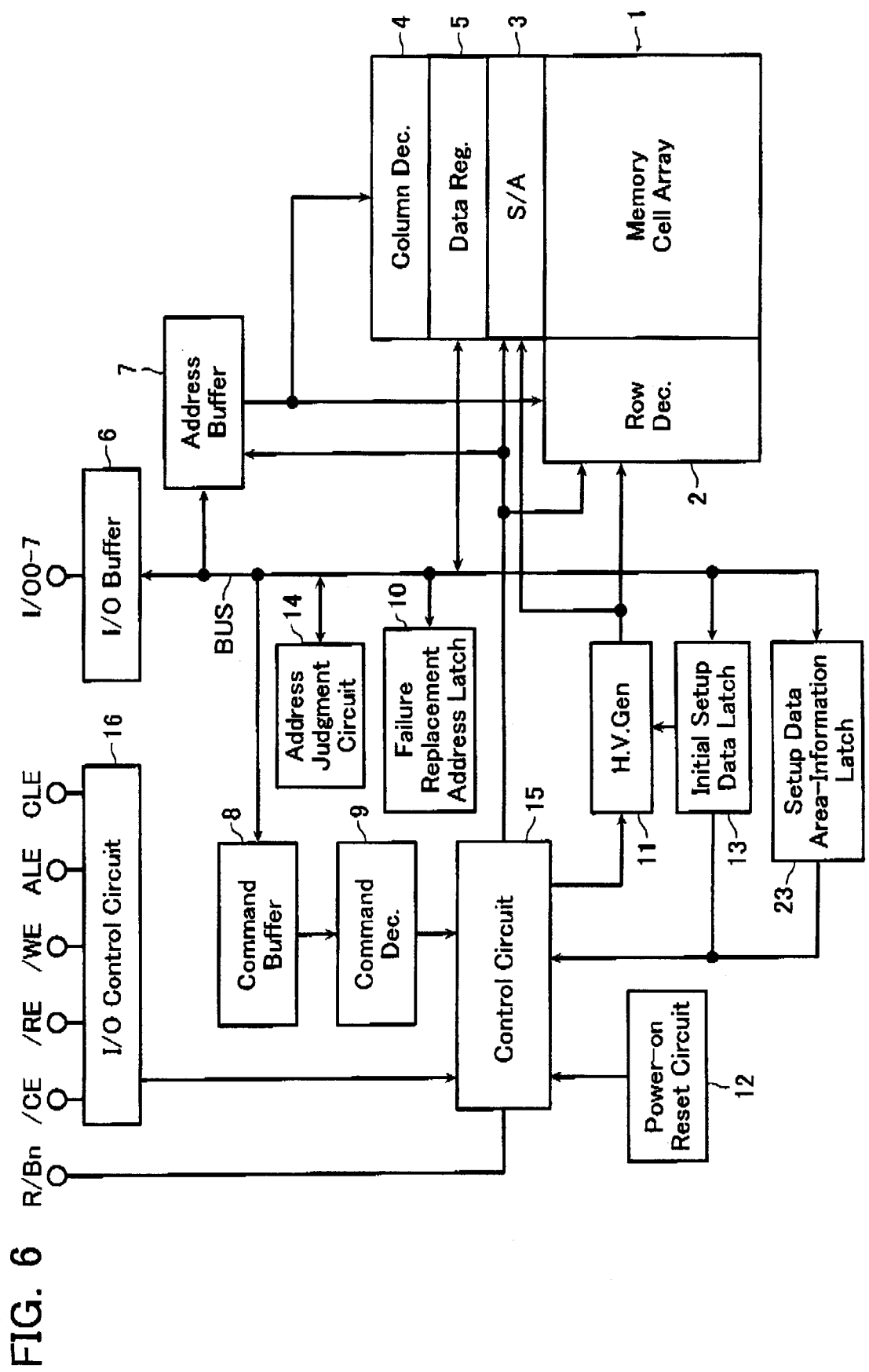
FIG. 6 is a block diagram showing a configuration of a NAND type flash memory according to the second embodiment.

FIG. 6 is a block diagram showing a configuration of a memory according to the second embodiment of the present invention. In addition, since elements having the same function as those in the first embodiment are given the same numerals, the detailed explanation thereof is omitted hereinbelow.

The feature of the second embodiment resides in that area information selecting an initial setup data area is obtained from the conventional input pins provided in the I/O control circuit 16.

The I/O control circuit 16 is provided with a chip enable pin /CE, a read enabling pin /RE, a write enabling pin /WE, an address latch enabling pin /ALE, and a command latch enabling pin/CLE. These pins and an external input pins I/O 0-7 constitute a pin group for inputting data, an address and a command.

Out of these conventional input pins, a pin which is out of use when a power supply is turned on is set at "H" or "L", so that area information is obtained by reading the state "H" or "L" at the time of the power supply start.

Moreover, when setting up two or more initial setup data areas, the state "H" or "L" of plural input pins out of the conventional input pins may be read. The area information inputted from the input pin is stored in the setup data area-information latch 23. Thereafter, initial setup data area is read based on the area information stored in this setting data area-information latch 23.

In this way, by inputting area information from the conventional input pin, the initial setup data area selection pin 17 used in the first embodiment may be omitted. Specifically, when two or more initial setup data areas are set up, the first embodiment needs plural pins for obtaining area information. In contrast, in the second embodiment, it is not necessary to prepare two or more additional input pins, since area information is obtained from the conventional input pins provided in the I/O control circuit.

The Third Embodiment

Figure 7:
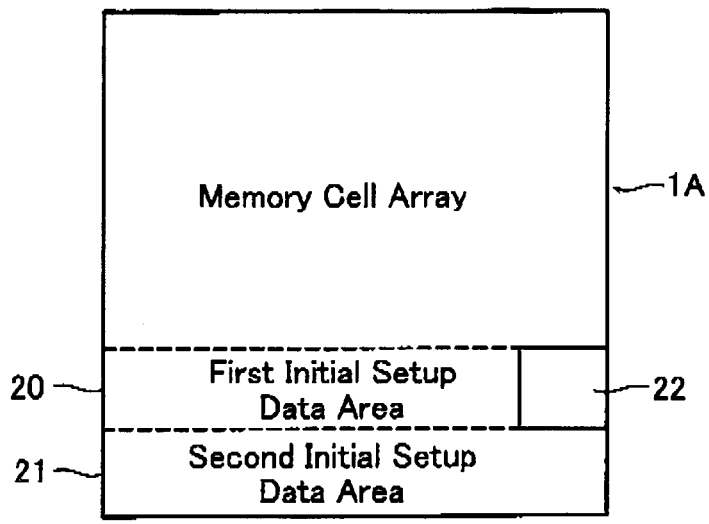
FIG. 7 is a diagram showing a configuration of a memory cell array of the NAND type flash memory according to the third embodiment.

FIG. 7 is a diagram showing a configuration of a memory cell array 1A of the memory according to the third embodiment of the present invention. Note that since the whole memory according to the third embodiment is the same in structure as FIG. 6, the explanation thereof is omitted hereinbelow.

The feature of the third embodiment resides in that the area information selecting an initial setup data area is stored in the initial setup data area.

The area information 22 is stored in the first initial setup data area 20: the same page where one set of initial setup data is stored. In addition, this area information 22 is programmed in the last test process for the memory after the first initial setup data area 20 and the second initial setup data area 21 has been programmed in the memory cell array 1A.

Figure 8:
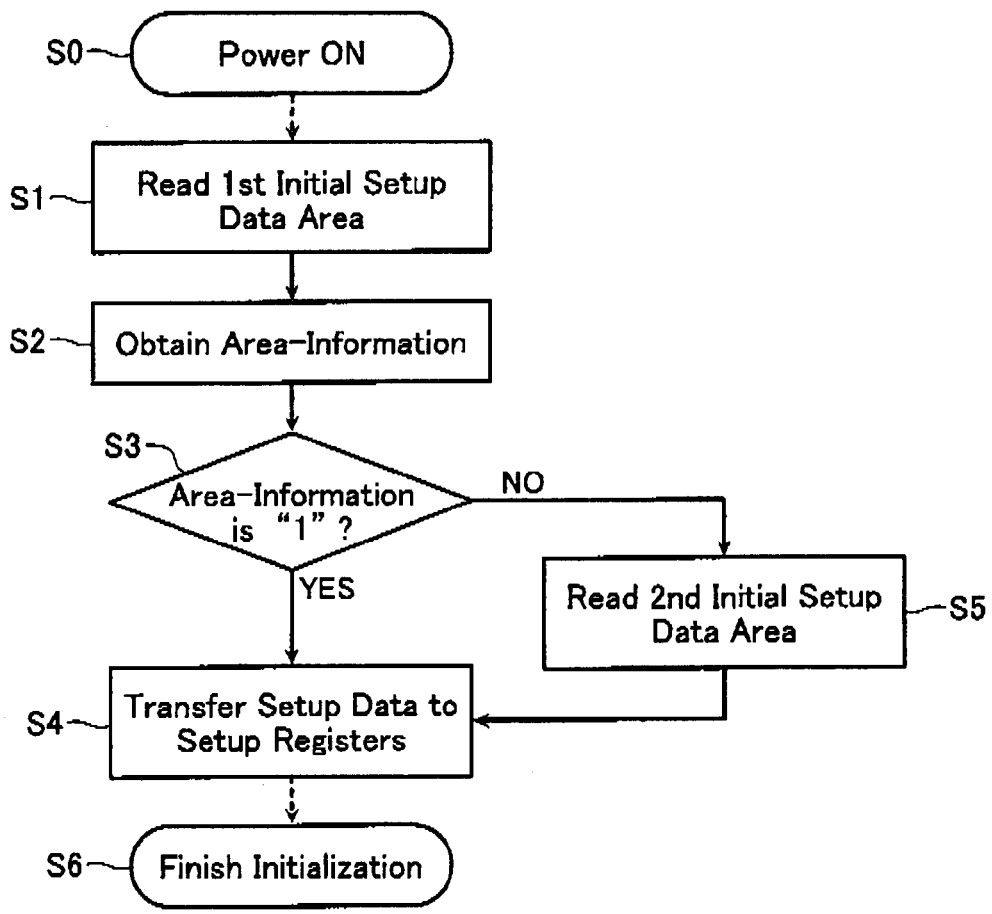
FIG. 8 is a diagram showing the control procedure of initial setup operation in the NAND type flash memory according to the third embodiment.

FIG. 8 is a diagram showing the flow of initial setup operation of this memory. If a power supply start is detected (Step S0), the first initial setup data area 20 is read (Step S1), and the area information 22 is obtained (Step S2).

Next, it is judged that whether the obtained area information 22 specifies the first initial setup data area 20 or not (Step 53).

If the area information 22 selects the first initial setup data area 20, initial setup data stored in the first initial setup data area 20 is transferred to the various setting registers including the initial setup data latch 13 and the failure replacement address latch 10 (Step S4).

In contrast, if it is judged in Step 3 that the area information 22 selects the second initial setup data area 21, the second initial setup data area 21 is read again (Step S5). Thereafter, the initial setup data from the second initial setup data area 21 is transferred into the various setting registers including the initial setup data latch 13 and the failure replacement address latch 10 (Step S4), and initialization operation is completed (Step S6).

In the third embodiment, the area information 22 is programmed in the last test process just before the memory product shipment. Accordingly, it is easy for a manufacturer to perform production control like the other embodiments.

The Fourth Embodiment

Figure 9:
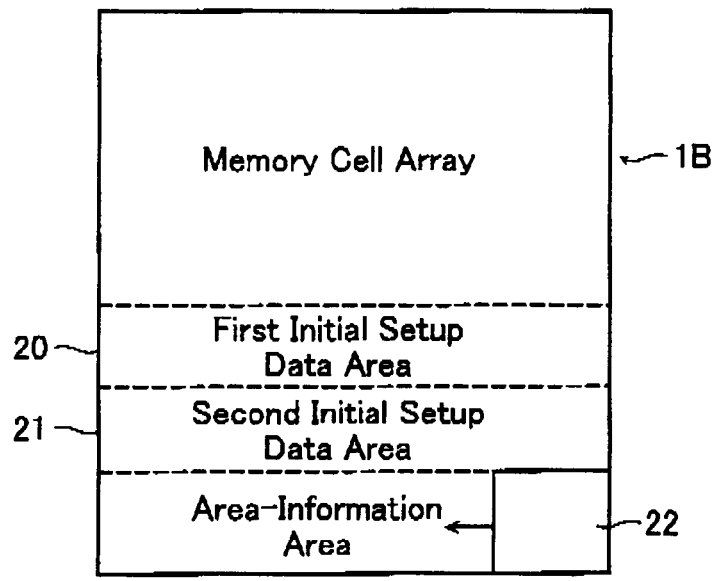
FIG. 9 is a diagram showing a configuration of a memory cell array of the NAND type flash memory according to the fourth embodiment.

FIG. 9 is a diagram showing a configuration of a memory cell array 1B of the memory according to the fourth embodiment of the present invention. Note that since the whole memory according to the fourth embodiment is the same in structure as FIG. 6, the explanation thereof is omitted hereinbelow.

The feature of the fourth embodiment resides in that the area information 22 is programmed in an area separated from the first initial setup data area 20 and the second initial setup data area 21.

Figure 10:
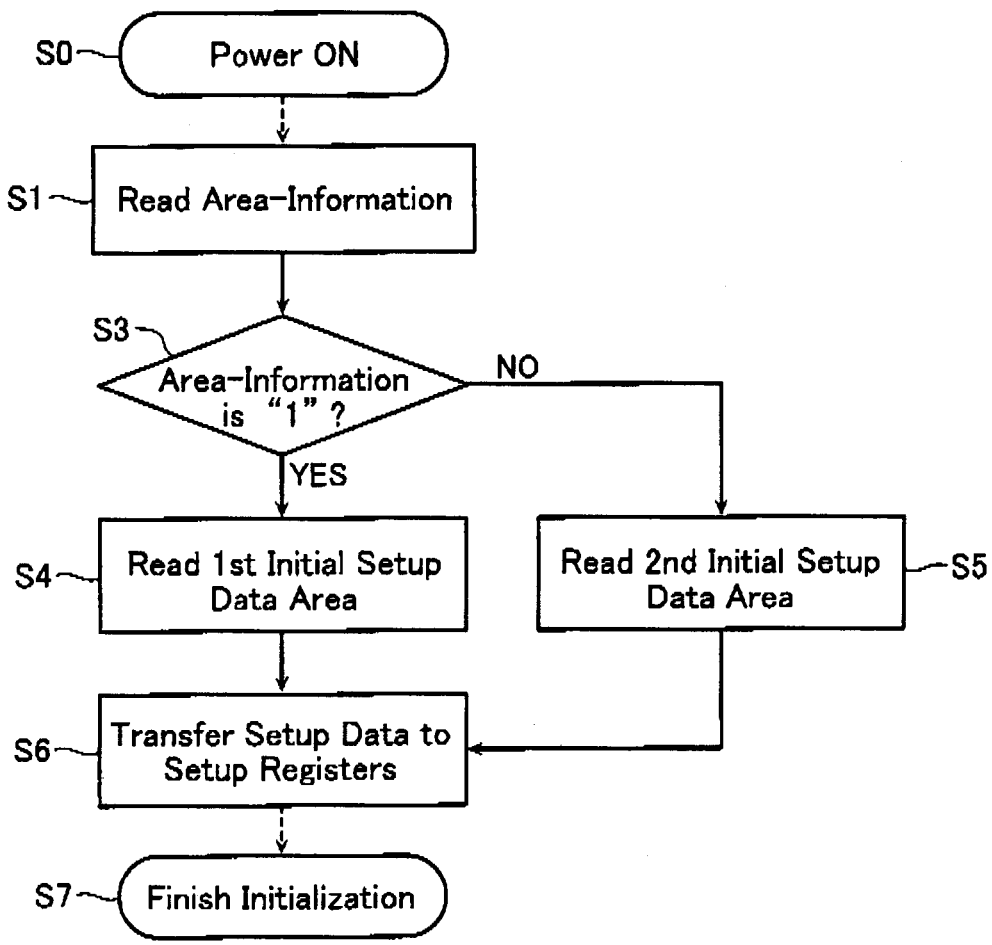
FIG. 10 is a diagram showing the control procedure of initial setup operation in the NAND type flash memory according to the fourth embodiment.

FIG. 10 is a diagram showing the flow of initial setup operation of this memory. If a power supply start is detected (Step S0), the area information is read (Step S1).

Next, it is judged that whether the read area information 22 specifies the first initial setup data area 20 or not (Step S3). If the area information 22 specifies the first initial setup data area 20, the initial setup data stored in the first initial setup data 20 is read (Step S4). The initial setup data stored in the first initial setup data area 20 is transferred to the various setting registers including the initial setup data latch 13 and failure replacement address latch 10 (S6). Thereby, initialization operation is completed (S7).

On the other hand, if it is judged in Step S3 that the area information 22 specifies the second initial setup data area 21, the second initial setup data area 21 is read (S5). The initial setup data stored in the second initial setup data area 21 is transferred into the various setting registers including the initial setup data latch 13 and the failure replacement address latch 10 (S6). Thereby, initialization operation is completed (S7).

As described above, the area information 22 is programmed in a page different from that of the first initial setup data area 20 and the second initial setup data area 21. Since this area information 22 is read first, operation for reading the first initial setup data area 20 or the second initial setup data area 21 occurs once. Thereby, initial setup operation time may be shorter.

The Fifth Embodiment

Figure 11:
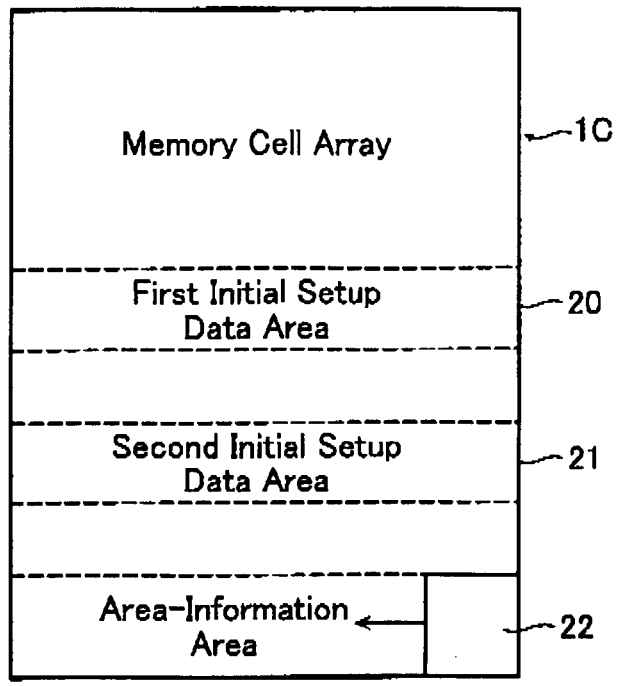
FIG. 11 is a diagram showing a configuration of a memory cell array in the NAND type flash memory according to the fifth embodiment.

FIG. 11 is a diagram showing a configuration of a memory cell array 1C of the memory according to the fifth embodiment of the present invention. Note that since the whole memory according to the fifth embodiment is the same in structure as FIG. 6, the explanation thereof is omitted hereinbelow.

The feature of the fifth embodiment is as follows.

That is, pages provided with the first initial setup data area 20, the second initial setup data area 21, or the area information 22 are arranged at any discrete positions from one another. The area information 22 stores an address of the first initial setup data area 20 or the second initial setup data area 21.

Figure 12:
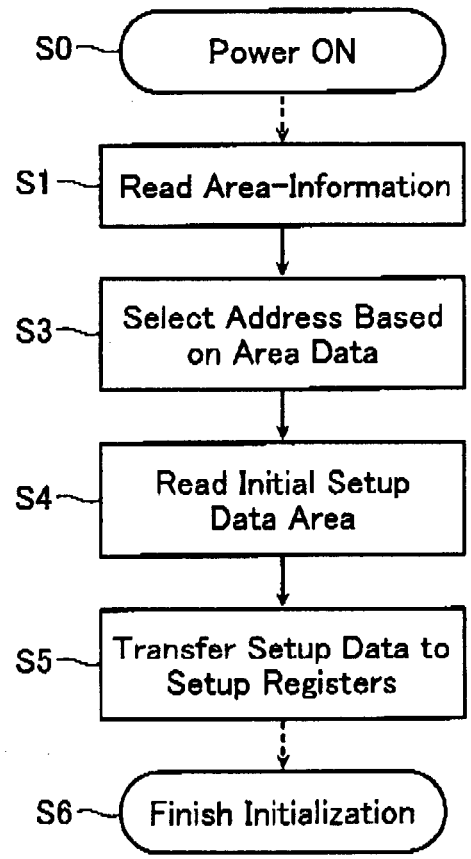
FIG. 12 is a diagram showing a control procedure of initial setup operation in the NAND type flash memory according to the fifth embodiment.

FIG. 12 is a diagram showing the flow of initial setup operation of this memory. If a power supply start is detected (Step S0), the area information 22 is read (Step S1).

An address of the area that is specified by the obtained area information 22 is set (Step S3), and this address shows the area where the first initial setup data area 20 or the second initial setup data area 21 exists. Either the first initial setup data area 20 or the second initial setup data area 21 is read.

The initial setup data read from the initial setup data area is transferred into the various registers including the initial setup data latch 13 and the failure replacement address latch 10 (Step S5), and initialization operation is completed (Step S6).

In this way, the flexibility of the layout in the memory cell array 1C may be raised, since the first initial setup data area 20, the second initial setup data area 21, and the area that stores the area information 22 are arranged at any positions in the memory cell array 1C.

The Sixth Embodiment

Figure 13:
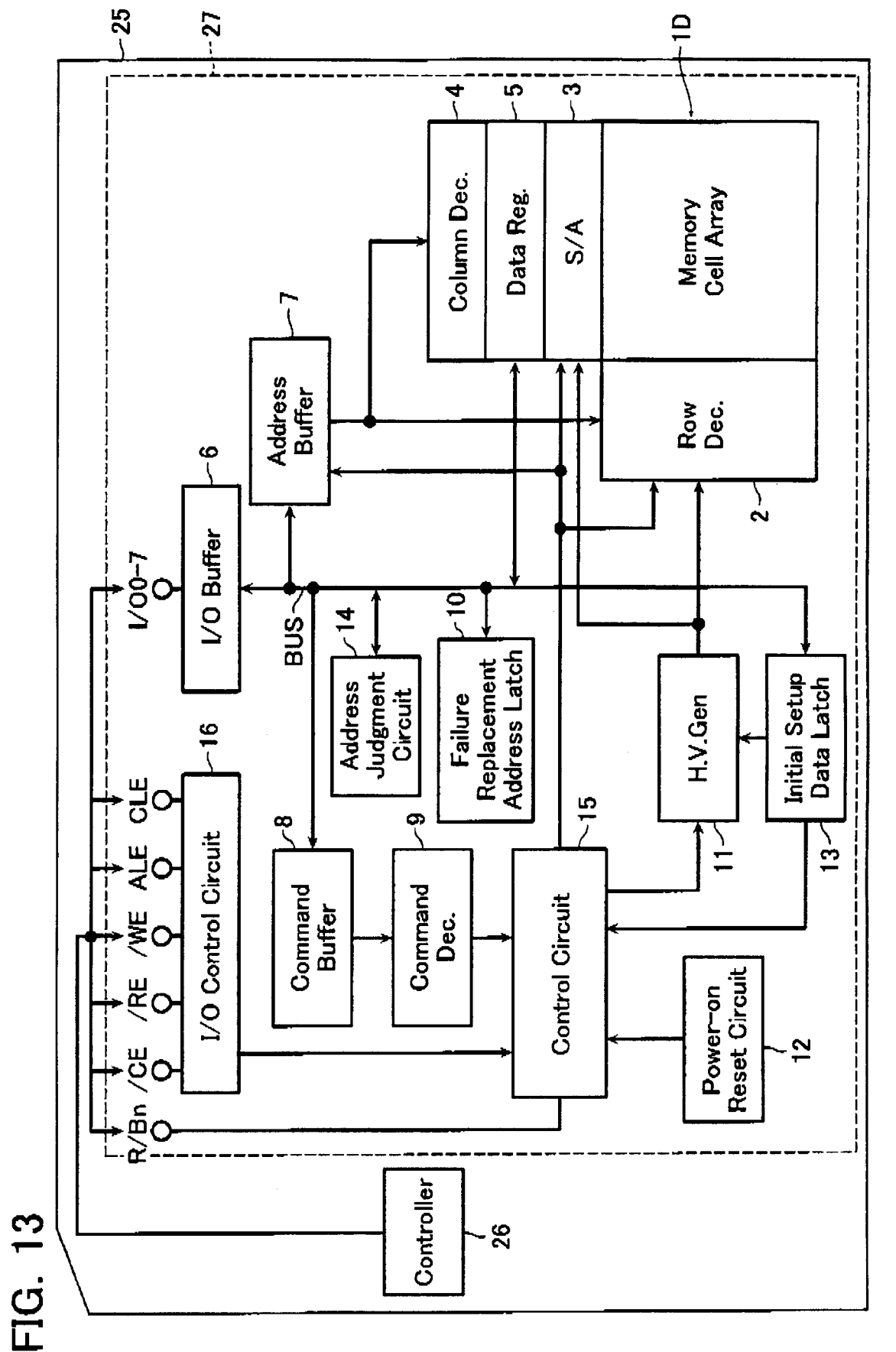
FIG. 13 is a block diagram showing a configuration of a memory system according to the sixth embodiment.
Figure 14:
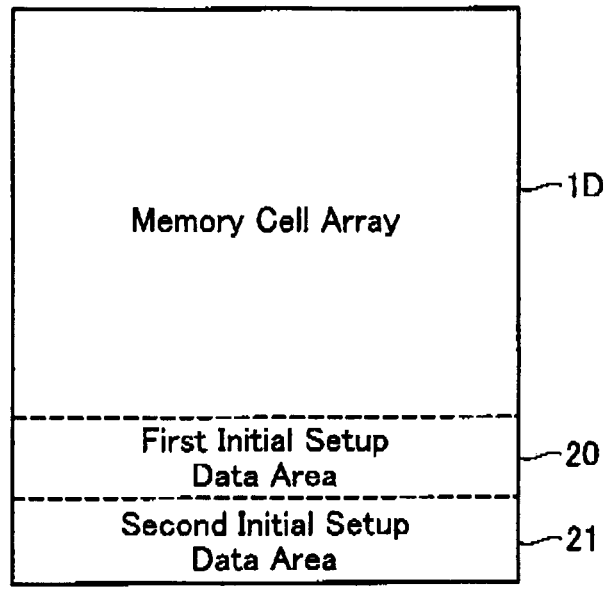
FIG. 14 is a diagram showing a configuration of a memory call array in the NAND type flash memory in the memory system according to the sixth embodiment.

FIG. 13 is a block diagram showing a configuration of a memory system 25 according to the sixth embodiment of the present invention. Note that FIG. 14 is a diagram showing a configuration of a memory cell array 1D in the memory 27 of this memory system 25.

The feature of the sixth embodiment resides in that a memory 27 is mounted in the semiconductor memory system 25 and area information is inputted from the controller 26 installed in this memory system 25.

The memory cell array 1D has the first initial setup data area 20 and the second initial setup data area 21. In the sixth embodiment, area information is set by inputting a initial setup command. This command is input at input pins (a chip enable pin /CE, a read enabling pin /RE, I/O, a write enabling pin /WE, an address latch enabling pin /ALE, a command latch enabling pin /CLE, and external input pin I/O 0-7) from a controller 26.

Figure 15:
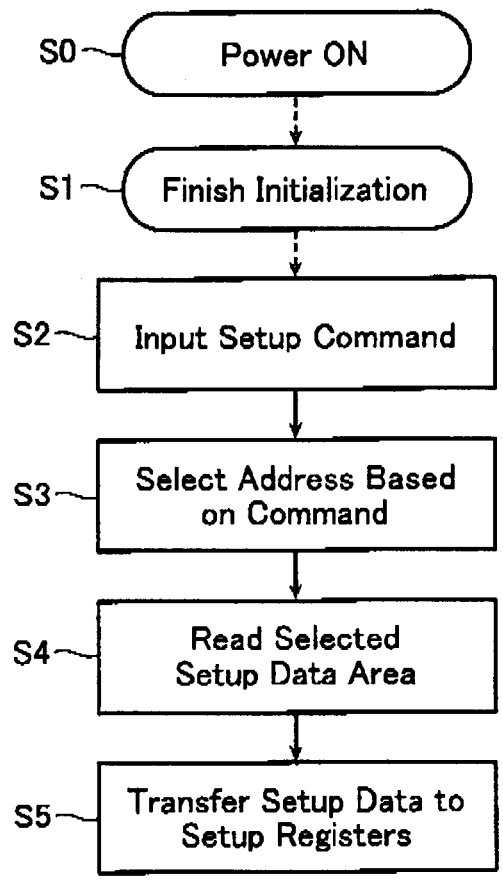
FIG. 15 is a diagram showing a control procedure of initial setup operation in the non-NAND type flash memory in the memory system according to the sixth embodiment.

FIG. 15 is a diagram showing the flow of initial setup operation of this memory system. When a power supply start is detected (Step S0), initializing operation of peripheral circuits and an internal voltage circuit is conducted (Step S1). If the initial setup command containing area information is input through the input pins from the controller 26 (Step S2), an address of an area in the memory cell array 1D is selected, according to the address of an area included in the initial setup command (Step S3).

Either the first initial setup data area 20 or the second initial setup data area 21 that is specified by the address is read (Step S4). The initial setup data read from the area 20 or 21 is transferred into the various registers including the initial setup data latch 13 and the failure replacement address latch 10 (Step S5).

In this way, by inputting an initial setup command from the controller 26, a manufacturer of a memory system may choose the operation condition of the memory even after the shipment of the memory product, according to a usage or a application thereof.

The Seventh Embodiment

Figure 16:
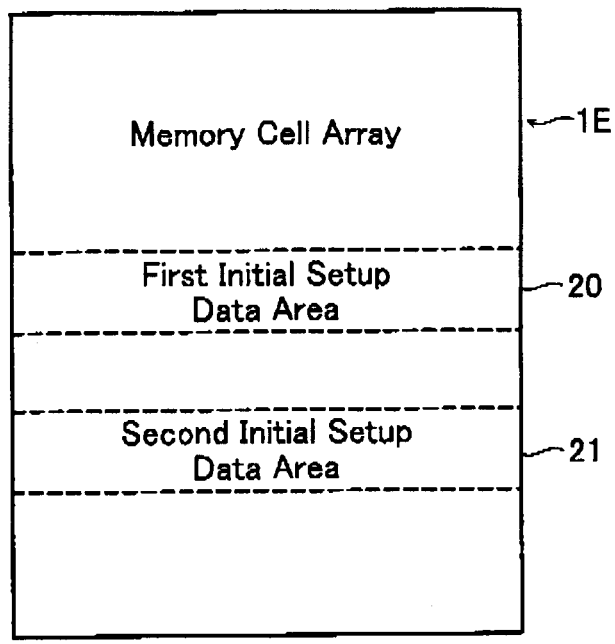
FIG. 16 is a diagram showing a configuration of a memory cell array of the NAND type flash memory in the memory system according to the seventh embodiment.

FIG. 16 is a diagram showing a configuration of a memory cell array 1E included in a memory in a memory system according to the seventh embodiment of the present invention.

The feature of the seventh embodiment resides in that the initial setup data areas 20 and 21 are arranged at any positions in the memory cell array 1E. Note that the configuration block diagram of the memory system of this embodiment is the same as that of the configuration block diagram shown in the sixth embodiment (FIG. 13).

Figure 17:
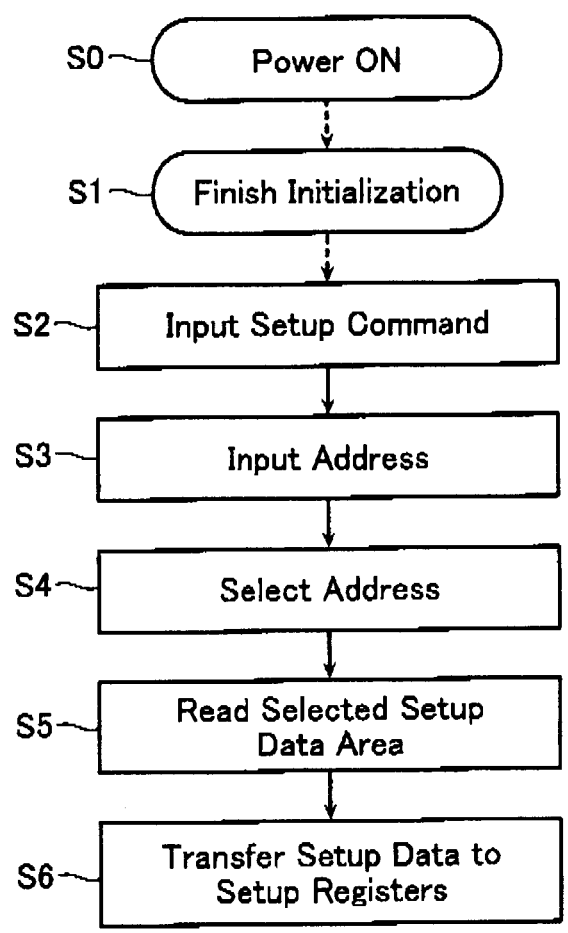
FIG. 17 is a diagram showing a control procedure of initial setup operation in the NAND type flash memory in the memory system according to the seventh embodiment.

FIG. 17 is a diagram showing a flow of initial setup operation of this memory system. After a start of power supply has been detected (Step S0) and initial setup operation of peripheral circuits and an internal voltage circuit has been performed (Step S1), an initial setup command is inputted through the input pins from the controller 26 (Step S2).

Furthermore, if an address of the initial setup data area storing initial setup data to be set is inputted (Step S3), either the first initial setup data area 20 or the second initial setup data area 21 specified by this address is read (Step S4), thereby the initial setup data stored therein is transferred into various registers (Step S5).

In the sixth and seventh embodiments, the controller 26 may perform initial setup corresponding to different operation conditions. Therefore, it is possible to divide the memory cell array 1E into plural address spaces and to allocate different operation conditions to the plural address spaces. That is, a first address space may be provided with the initial setup data stored in the first initial setup data area 20, and a second address space may be provided with the initial setup data stored in the second initial setup data area 21.

In addition, in the above-described embodiments, although the NAND type flash memory is explained as an example, the present invention is not limited to this. This invention may be applied also to other types of Flash Memories such as a NOR type, an AND type, and a DINOR type, and also be applied to other types of re-writable nonvolatile memories such as phase change memory and resistive switching memory.

What is claimed is:

1. A non-volatile semiconductor memory device comprising:
   a memory cell array comprising electrically-rewritable non-volatile memory cells arranged, and including areas storing two or more sets of initial setup data specifying different operation conditions;
   a sense amplifier detecting data in the memory cell array;
   an initial setup data latch where initial setup data read from the memory cell array via the sense amplifier is transferred therein and stored therein; and
   a control circuit controlling reading one set of initial setup data out of the two or more sets of initial setup data based on area information selecting at least one set of initial setup data.

2. The non-volatile semiconductor memory device according to claim 1, further comprising a selection pin inputting the area information into the control circuit.

3. The non-volatile semiconductor memory device according to claim 1, further comprising input pins used to input data, an address, or a command,
   wherein the area information is input from at least one of the input pins.

4. The non-volatile semiconductor memory device according to claim 1, wherein the area information is stored in the memory cell array, and is read at the time when a power supply is turned on.

5. The non-volatile semiconductor memory device according to claim 1, wherein the area information is input into the control circuit by inputting a command from outside.

6. The non-volatile semiconductor memory device according to claim 1, wherein the initial setup data includes initial setup data for two-value cells storing 1-bit data per one cell, and initial setup data for multi-value cells storing data of 2 bits or more per one cell.

7. The non-volatile semiconductor memory device according to claim 1,
   wherein the initial setup data includes two or more different sets of initial setup data that are specified based on a speed of writing, erasing and reading operation, and a reliability of data.

8. The non-volatile semiconductor memory device according to claim 1, wherein each of 2 or more sets of the initial setup data is stored in a different page in the memory cell array.

9. The non-volatile semiconductor memory device according to claim 1, wherein two or more sets of the initial setup data includes:
   first initial setup data providing a first writing speed and a first reliability of data; and
   second initial setup data providing a second writing speed and a second reliability of data.

10. The non-volatile semiconductor memory device according to claim 1, wherein two or more sets of the initial setup data includes:
    first initial setup data providing a first guaranteed number of data rewriting and a first reliability of data; and
    second initial setup data providing a second guaranteed number of data rewriting and a second reliability of data.

11. The non-volatile semiconductor memory device according to claim 8, wherein the area information is stored in a page different from a page storing the initial setup data.

* * * * *